(12) United States Patent
Heinemann

(10) Patent No.: US 6,709,475 B2
(45) Date of Patent: Mar. 23, 2004

(54) INSTALLATION FOR PROCESSING WAFERS

(75) Inventor: Bernhard Heinemann, Greifenberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/963,956

(22) Filed: Sep. 26, 2001

(65) Prior Publication Data

US 2002/0074025 A1 Jun. 20, 2002

Related U.S. Application Data

(63) Continuation of application No. PCT/DE00/00940, filed on Mar. 24, 2000.

(30) Foreign Application Priority Data

Mar. 26, 1999 (DE) .......................................... 199 13 918

(51) Int. Cl.[7] .................................................. F24F 3/16
(52) U.S. Cl. ..................... 55/385.2; 55/385.1; 454/187; 454/228; 454/230; 454/233; 454/236
(58) Field of Search ............................. 55/385.1, 405.2; 454/187, 228, 230, 233, 236

(56) References Cited

U.S. PATENT DOCUMENTS

| | | | |
|---|---|---|---|
| 5,096,477 A | * | 3/1992 | Shinoda et al. ............ 55/385.2 |
| 5,344,365 A | | 9/1994 | Scott et al. |
| 5,350,336 A | * | 9/1994 | Chen et al. ................. 454/187 |
| 5,928,077 A | * | 7/1999 | Kisakibaru ................. 454/187 |
| 6,251,155 B1 | * | 6/2001 | Fukushima ................. 454/187 |
| 6,306,189 B1 | * | 10/2001 | Renz ........................... 454/187 |
| 6,347,990 B1 | * | 2/2002 | Sung et al. ................. 454/187 |
| 6,368,208 B1 | * | 4/2002 | Minoshima ................. 454/187 |

FOREIGN PATENT DOCUMENTS

| | | |
|---|---|---|
| JP | 06 143 067 | 5/1994 |
| JP | 07 058 073 | 3/1995 |
| JP | 11 283 918 | 10/1999 |

* cited by examiner

Primary Examiner—Blaine Copenheaver
Assistant Examiner—Minh-Chau T. Pham
(74) Attorney, Agent, or Firm—Laurence A. Greenberg; Werner H. Stemer; Ralph E. Locher

(57) ABSTRACT

An installation for processing wafers that includes fabrication units, which are located in a clean room, and includes a supply system for supplying and discharging operating substances for the fabrication units. The supply system has first supply lines and first discharge lines, in which operating substances that are heavier than the surrounding atmosphere are downwardly guided. The supply system has second supply lines and second discharge lines, in which the lighter operating substances are upwardly guided.

14 Claims, 2 Drawing Sheets

INSTALLATION FOR PROCESSING WAFERS

CROSS-REFERENCE TO RELATED APPLICATION

This application is a continuation of copending International Application No. PCT/DE/00940, filed Mar. 24, 2000, which designated the United States.

BACKGROUND OF THE INVENTION

Field of the Invention

The invention relates to an installation for fabricating semiconductor products. Installations of this type may be designed, in particular, as installations for processing wafers.

These installations include a large number of fabrication units which are used to carry out various fabrication processes for processing the wafers. These fabrication processes are, in particular, etching processes, wet-chemical processes, diffusion processes as well as various cleaning processes, such as for example CMP (chemical-mechanical polishing) processes. One or more fabrication units are provided for each of these fabrication processes.

The entire process of processing the wafers is subject to stringent demands with regard to cleanliness, so that the fabrication units are configured in a clean room or in a system of clean rooms.

The clean room or the system of clean rooms is usually configured on one story of a building.

To supply and discharge operating substances for the individual fabrication units, a supply system is provided.

Operating substances of this type include, in particular, liquid and gaseous operating substances. Liquid operating substances which are required include, in particular, pure water and ultrapure water for a large number of fabrication processes, such as for example cleaning processes, etching and diffusion processes. Furthermore, another liquid operating substance which is required is cooling water to cool machines and installations in the individual fabrication units. Finally, various chemicals in liquid form or in gaseous state are required in order to carry out various fabrication processes.

The supply system has a plurality of reservoirs in which the operating substances which are to be fed to the fabrication units are stored. Moreover, there are a plurality of reservoirs to which operating substances which are removed from the fabrication units are fed.

The reservoirs of the supply system are distributed over one story or several stories of the building which lie below the story on which the clean room is located.

To supply the fabrication units with liquid operating substances, supply lines lead from the corresponding reservoirs to the respective fabrication units. These supply lines lead upward from the reservoirs to the floor of the story of the clean room and, ultimately, open out of the floor in order to be fed to the fabrication units via connections.

A drawback of this configuration is that the liquid operating media have to be pumped upward in the supply lines by means of pumps so that they can be fed to the fabrication units. This on the one hand requires considerable installation costs and on the other hand entails a high energy consumption.

The liquids in the supply lines typically have to overcome height differences of from 2 meters up to 10 meters. To pump up the liquids, the hydrostatic pressure in the supply lines has to be overcome. Moreover, compensating for frictional losses on the inner edges of the supply lines as the liquids flow through require considerable energy.

In some fabrication units, waste air is formed during the processing of the wafers, and this waste air is first contaminated and secondly heated to a greater or lesser extent. This waste air is extracted from the fabrication unit using blowers or the like and is guided, via discharge lines, into a reservoir which is situated on one of the stories which lie below the clean room.

Since the heated waste air rises within the fabrication unit because of convection, considerable energy is required in order to suck the waste air out into the reservoir, which lies below the fabrication unit, via the discharge lines.

SUMMARY OF THE INVENTION

It is accordingly an object of the invention to provide an installation for fabricating semiconductor products, in particular, for fabricating wafers, which overcomes the above-mentioned disadvantageous of the prior art apparatus of this general type. In particular, it is an object of the invention to provide a supply system for such an installation, which allows operating substances to be supplied to and discharged from fabrication units of the installation using the minimum possible energy and at the lowest possible cost.

With the foregoing and other objects in view there is provided, in accordance with the invention, an installation for fabricating semiconductor products, that includes: a plurality of fabrication units; at least one clean room in which at least one of the plurality of the fabrication units is configured; and a supply system for supplying and for discharging operating substances for the fabrication units. The supply system includes first supply lines and first discharge lines for downwardly guiding operating substances that are heavier than a surrounding atmosphere. The supply system also includes second supply lines and second discharge lines for upwardly guiding operating substances that are lighter than the surrounding atmosphere.

It should be clear that the installation has a supply system which has first supply and first discharge lines, in which operating substances which are heavier than the surrounding atmosphere are guided from the top downward, and second supply and second discharge lines, in which the lighter operating substances are guided from the bottom upward.

Therefore, in this supply system, operating substances are supplied and discharged using the force of gravity. Operating substances which are heavier than the surrounding atmosphere are guided from the top downward in the first supply lines. In the process, in particular liquid operating substances, such as for example pure water, ultrapure water or cooling water, are fed to the fabrication units from reservoirs which are configured above the corresponding fabrication units. These reservoirs are expediently configured on stories of the building, containing the installation, that lie above the clean room. Accordingly, the first discharge lines lead to reservoirs in stories which lie below the clean room. The liquids are discharged from the fabrication units into these reservoirs.

This method of supplying and discharging entails a minimal outlay on energy. Since the liquids are heavier than the surrounding atmosphere, their own weight assists the flowing movement of the liquids from the top downward in the first supply and discharge lines, so that there is no need to provide any pump systems, or only a few pump systems are required, in order to supply the liquids.

Accordingly, the operating substances which are lighter than the surrounding atmosphere are guided from the bottom upward in the second supply and discharge lines.

By way of example, heated and contaminated waste air is removed upward from the fabrication unit via second discharge lines. This waste air is expediently trapped in reservoirs which are located on stories which lie above the clean room.

Since the heated and contaminated waste air, as a result of convection, flows toward the ceiling of the fabrication unit, the waste air can be extracted from the ceiling out of the fabrication unit and into the discharge lines without great outlay on energy and materials.

In accordance with an added feature of the invention, the operating substances that are supplied by the supply system include liquid chemicals.

In accordance with an additional feature of the invention, the liquid chemicals are etching solutions for carrying out etching processes.

In accordance with another feature of the invention, the etching solutions are selected from the group consisting of KOH and NaOH.

In accordance with a further feature of the invention, the liquid chemicals are selected from the group consisting of alkaline solutions for cleaning wafers and acidic solutions for cleaning wafers.

In accordance with a further added feature of the invention, the operating substances that are supplied by the supply system includes etching gases for carrying out etching processes.

In accordance with a further additional feature of the invention, the etching gases are halogen compounds.

In accordance with a concomitant feature of the invention, the operating substances that are supplied by the supply system include oxygen for cleaning wafers during cleaning processes and nitrogen for drying the wafers.

Other features which are considered as characteristic for the invention are set forth in the appended claims.

Although the invention is illustrated and described herein as embodied in an installation for processing wafers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
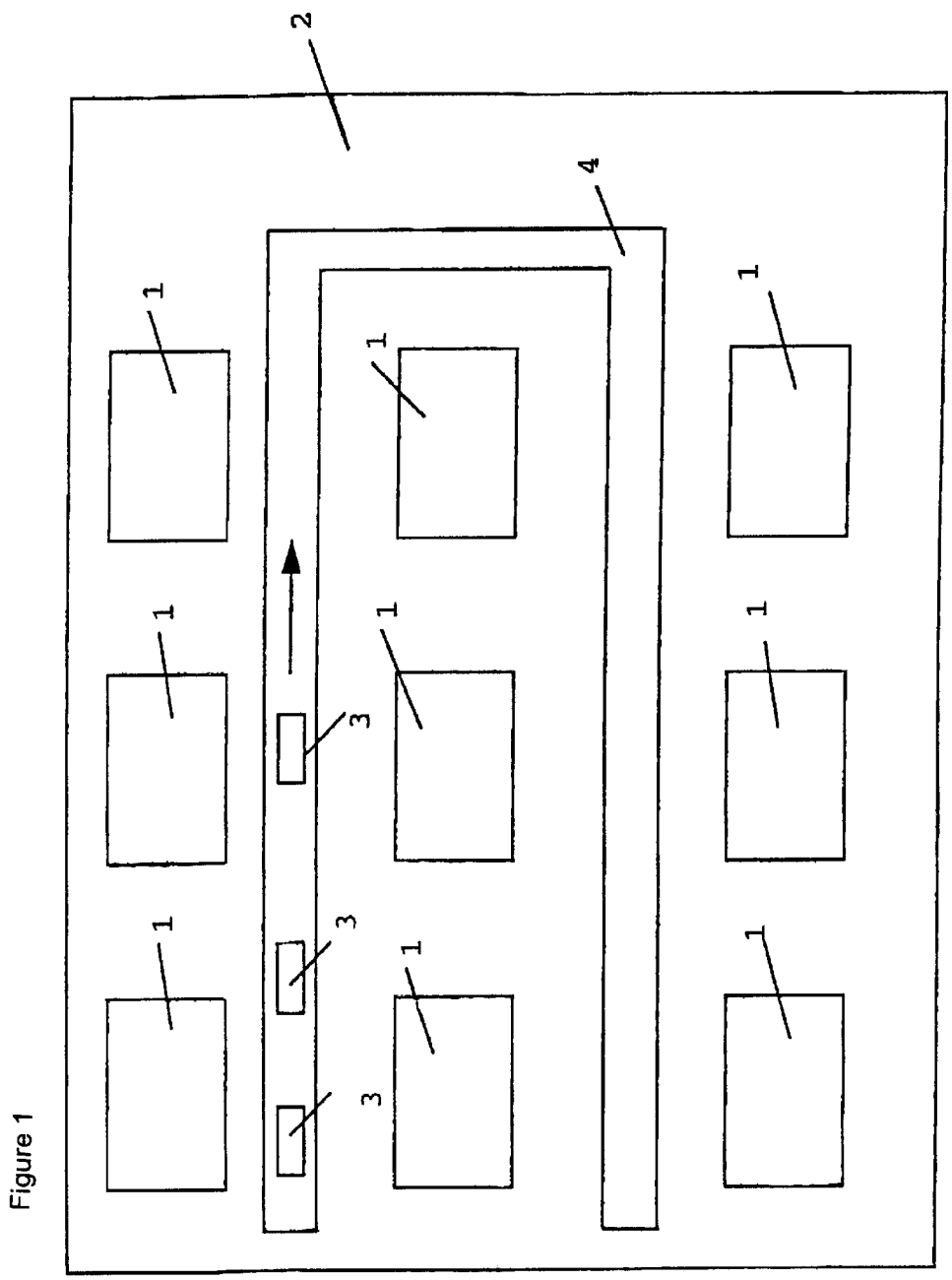
FIG. 1 diagrammatically depicts an installation for processing wafers having a plurality of fabrication units in a clean room.

Referring now to the figures of the drawing in detail and first, particularly, to FIG. 1 thereof, there is shown a configuration of fabrication units 1 of an installation for processing wafers. The fabrication units 1 are configured in a clean room 2 and are used to carry out the fabrication processes involved in the processing of the wafers. These fabrication processes include in particular etching processes, wet-chemical processes, diffusion processes and cleaning processes. One or more fabrication units 1 are provided for all the fabrication processes.

The fabrication units 1 are connected via a transport system. Cassettes 3 which are filled with wafers are fed to the fabrication units 1 via the transport system. The transport system has a conveyor system 4, such as for example roller conveyors or continuous conveyors, on which the cassettes 3 are transported. Moreover, the transport system may have a predetermined number of storage devices (not shown) for holding the wafers temporarily.

Figure 2:
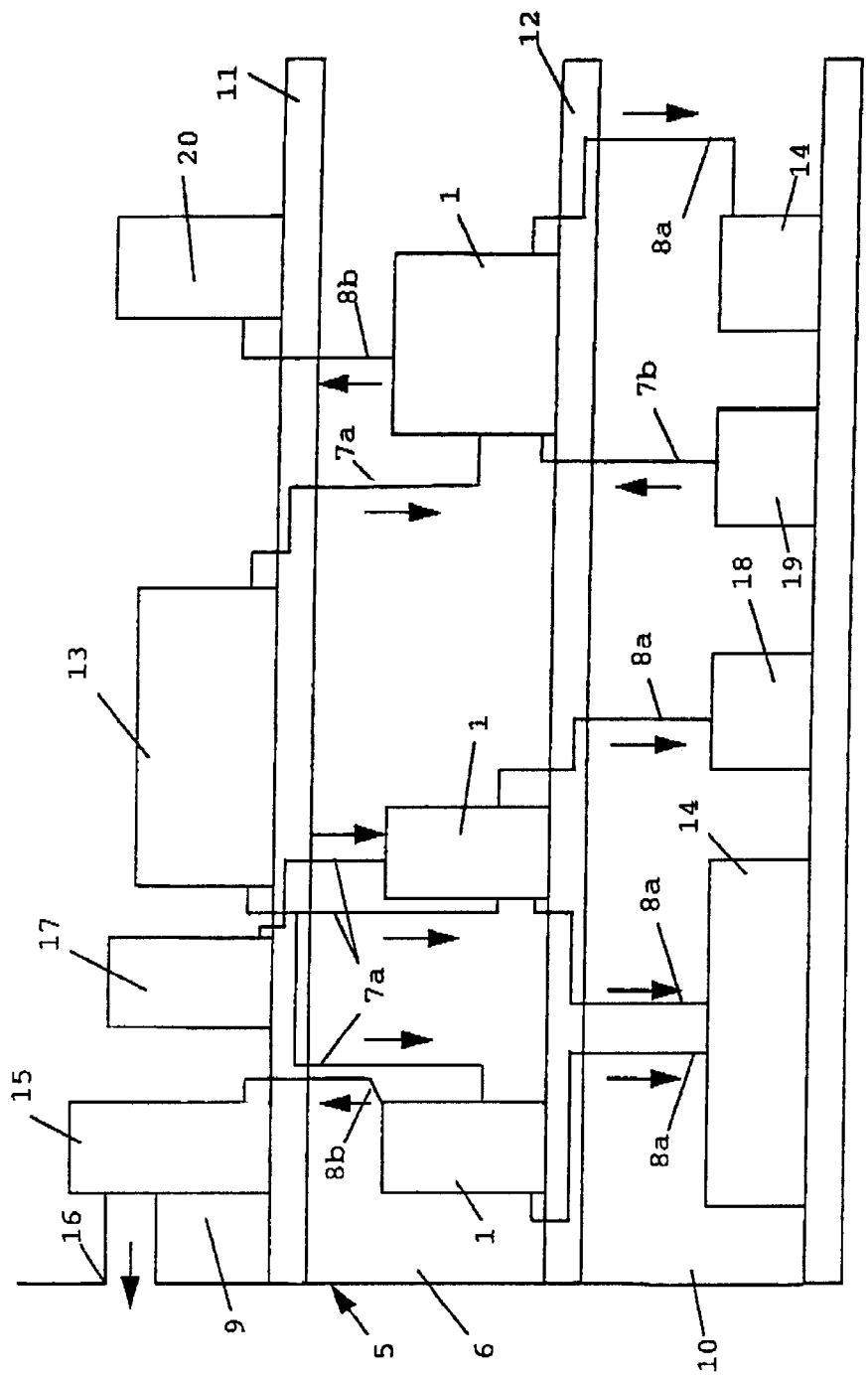
FIG. 2 shows a cross section through a building having a clean room as shown in FIG. 1 configured on one story and a supply system which is distributed over further stories.

As can be seen from FIG. 2, the fabrication unit 1 is located in a building 5. The clean room 2 together with the fabrication units 1 are located on one story 6 of the building 5.

The installation also has a supply system for supplying and discharging operating substances which are required for the fabrication processes that are carried out in the fabrication units 1.

The supply system has a plurality of reservoirs in which operating substances, which are fed to the fabrication units 1 via supply lines 7a, 7b, are stored. Moreover, there are reservoirs to which operating substances are fed from the fabrication units 1 via discharge lines 8a, 8b. In the present exemplary embodiment, these reservoirs are configured on two different stories 9, 10 of the building 5. One story 9 is located above the story 6 that includes the clean room 2, while the other story 10 is configured below the story 6 that includes the clean room 2.

According to the invention, the individual reservoirs in the two stories 9, 10 are configured in such a way that operating substances which are heavier than the surrounding atmosphere are fed to the fabrication units 1 via the first supply lines 7a which lead from the story 9 which lies above the clean room 2, through the ceiling 11 of the clean room 2, to the respective fabrication units 1. Accordingly, the operating substances, which are heavier than the surrounding atmosphere, are removed downward from the fabrication units 1 via first discharge lines 8a. The discharge lines 8a run through the floor 12 of the clean room 2 and lead to reservoirs in the story 10 which is below the clean room 2. The surrounding atmosphere is usually formed by air at room temperature conditions and standard pressure conditions.

By contrast, the operating substances which are lighter than the surrounding atmosphere are passed to the fabrication units 1 via second supply lines 7b from reservoirs which are configured in the story 10 which lies below the clean room 2. The second supply lines 7b run in part in the floor 12 of the clean room 2 and then carry the operating substances from the bottom upward, to the fabrication units 1. Accordingly, operating substances which are lighter than the surrounding atmosphere are guided, via second discharge lines 8b, from the fabrication units 1 to reservoirs which are configured in the story 9 which lies above the clean room 2. The discharge lines 8b which run upward in part pass through the ceiling 11 of the clean room 2.

The operating substances which are heavier than the surrounding atmosphere are, in particular, liquids. In addition, these operating substances may also be formed by gases with a corresponding density and at a corresponding temperature.

Operating substances which are lighter than the surrounding atmosphere are predominantly formed by gases.

The liquid operating substances used are typically pure water, ultrapure water and cooling water. Ultrapure water and pure water is required for a large number of fabrication processes, such as for example cleaning processes and diffusion processes. The cooling water is required to cool machines and installations in the individual fabrication units 1. Moreover, various liquid chemicals are used for different fabrication processes. These liquid chemicals are, for example, etching solutions for carrying out etching processes, such as for example KOH and NaOH, or alkaline or acidic solutions for cleaning the wafers.

Examples of gaseous operating substances are etching gases for carrying out etching processes. The etching gases may typically be formed by halogen compounds. Furthermore, oxygen is used for cleaning and hot nitrogen is used for the subsequent drying of wafers.

In general, installations for processing wafers include a large number of fabrication units 1 and a large number of reservoirs for supplying operating substances to the fabrication units 1 and for operating substances which have been removed from the fabrication units 1.

FIG. 2 shows a small part of an installation of this type for processing wafers.

In the part of a building 5 which is diagrammatically illustrated in FIG. 2, three fabrication units 1 are illustrated in the middle story 6 in the clean room 2.

A reservoir which is designed as a water reservoir 13 and in which ultrapure water is stored is provided on the story 9 which lies above the clean room. First supply lines 7a, which supply the three fabrication units 1 with ultrapure water, open out in the region of the base of the water reservoir 13.

The supply lines 7a initially run in the horizontal direction in the ceiling 11 of the clean room 2 and then, running vertically downward, open out to the fabrication units 1. The supply lines 7a open into the fabrication units 1 via connections (not shown). The installation height for the individual connections to the fabrication units 1 is selected in such a way that the ultrapure water is available in the corresponding fabrication unit 1 at the required height above the floor 12 of the clean room 2. Since the supply lines 7a only carry the ultrapure water in the horizontal direction or vertically downward, no pump capacity or only a very low pump capacity is required in order to feed the ultrapure water to the fabrication units 1.

In general, the ultrapure water is contaminated by the fabrication processes in the fabrication unit 1. Consequently, after a predetermined time, the contaminated water has to be removed from the fabrication units 1 as waste water. In the present exemplary embodiment, the waste water is passed out of the fabrication units 1, via first discharge lines 8a, into two reservoirs which are designed as collection vessels 14. These collection vessels 14 are configured on the story 10 which lies below the clean room 2. The discharge lines 8a open out at connections (not shown) to the fabrication units 1, and then in part run horizontally in the floor 12 of the clean room 2. From the floor 12 of the clean room 2, the discharge lines 8a then open out to run vertically downward toward the collection vessels 14. Finally, the discharge lines 8a are guided into the collection vessels 14 via connections (not shown). The contaminated waste water in the collection vessels 14 can be fed to a recycling installation (not shown), in which ultrapure water is recovered from the waste water. In this case too, the waste water, which is heavier than the surrounding atmosphere, is guided from the top downward via discharge lines 8a, so that no pump capacity or only a very low pump capacity is required in order to discharge the waste water into the collection vessels 14.

A second discharge line 8b leads upward from the ceiling of the fabrication unit 1, which is at the left-hand side of FIG. 2, to a reservoir which is configured on the story 9 above the clean room and which is designed as a gas reservoir 15. Contaminated and heated air from the interior of the fabrication unit 1 is passed into the gas reservoir 15 via this discharge line 8b. In the gas reservoir 15, the contaminated air is cleaned and is passed out of the building 5 via a waste-air duct 16. Since the heated, contaminated air is lighter than the atmosphere formed by the ambient air, the heated air rises in the fabrication unit 1, where it can be extracted with little outlay on energy and can be fed to the discharge line 8b. The supply of unused air from the clean room 2 can take place via a suction device (not shown) in the wall of the fabrication unit 1.

The middle fabrication unit 1 illustrated in FIG. 2 can be used in particular to carry out etching processes. For this purpose, etching solutions are fed to the fabrication unit 1 out of a reservoir, which is formed by a first tank 17, via first supply lines 7a. Having been used in the fabrication unit 1, the etching solutions are drained into a second tank 18 via first discharge lines 8a. The first tank 17 is configured on the story 9 which lies above the clean room 2, and the second tank 18 is configured on the story 10 which lies below the clean room 2, so that the etching solutions in the supply lines 7a and discharge lines 8a run from the top downward. In this way, it is possible to feed and remove the etching solutions to and from the fabrication unit 1 without using pumps or virtually without using pumps.

The fabrication unit 1 that is illustrated at the right-hand side of FIG. 2 is a fabrication unit 1 to which a heated gas, which is lighter than the surrounding atmospheric air, is fed. To keep the energy required to feed the gas to the fabrication unit 1 at a low level, a reservoir, which is designed as a gas reservoir 19 that contains the gas, is configured on the story 10 which lies directly below the clean room 2. A second supply line 7b leads upward from the gas reservoir 19 to the fabrication unit 1 and, in the process, passes through the floor 12 of the clean room 2. The supply line 7a runs vertically upward over virtually its entire length, so that the convective movement of the gas is optimally utilized.

Accordingly, a second discharge line 8b leads from the ceiling of the fabrication unit 1 to a reservoir, which is formed by a second gas reservoir 20. This gas reservoir 20 is configured on that story 9 which lies above the clean room 2, directly above the corresponding fabrication unit 1, so that in this case too the discharge line 8b runs vertically upward from a connection at the fabrication unit 1 and opens into the gas reservoir 20 via a connection (not shown).

I claim:

1. An installation for fabricating semiconductor products, comprising:
    a building having a first story, a second story higher than said first story, a third story lower than said first story, a plurality of upper stories above said first story, and a plurality of lower stories below said first story;
    a plurality of fabrication units;
    at least one clean room located in said first story, in which at least one of said plurality of said fabrication units is configured;
    a supply system for supplying operating substances to said plurality of said fabrication units and for discharging the operating substances from said plurality of said fabrication units;

said supply system including first supply lines and first discharge lines for downwardly guiding operating substances of greater density than a surrounding atmosphere;

said supply system including second supply lines and second discharge lines for upwardly guiding operating substances of less density than the surrounding atmosphere;

a plurality of reservoirs for holding the operating substances, said plurality of reservoirs being located at least in said second story and in said third story;

said plurality of reservoirs including first reservoirs for holding the operating substances in liquid form being of greater density than the surrounding atmosphere;

said plurality of reservoirs including second reservoirs for holding the operating substances in gaseous form being of greater density than the surrounding atmosphere;

said first reservoirs and said second reservoirs being located in said plurality of said upper stories;

said plurality of reservoirs including third reservoirs for holding the operating substances in liquid form being of greater density than the surrounding atmosphere;

said plurality of reservoirs including fourth reservoirs for holding the operating substances in gaseous form being of greater density than the surrounding atmosphere;

said third reservoirs and said fourth reservoirs being located in said plurality of said lower stories;

said plurality of reservoirs including fifth reservoirs for holding the operating substances in liquid form being of less density than the surrounding atmosphere;

said plurality of reservoirs including sixth reservoirs for holding the operating substances in gaseous form being of less density than the surrounding atmosphere;

said fifth reservoirs and said sixth reservoirs being located in said plurality of said lower stories;

said plurality of reservoirs including seventh reservoirs for holding the operating substances in liquid form being of less density than the surrounding atmosphere;

said plurality of reservoirs including eighth reservoirs for holding the operating substances in gaseous form being of less density than the surrounding atmosphere; and said seventh reservoirs and said eighth reservoirs being located in said plurality of said upper stories.

2. The installation according to claim 1, wherein said plurality of said reservoirs include collection vessels for holding liquid ones of the operating substances which have been removed from said plurality of said fabrication units.

3. The installation according to claim 1, wherein the operating substances that are supplied by said supply system includes liquid chemicals.

4. The installation according to claim 3, wherein the liquid chemicals are etching solutions for carrying out etching processes.

5. The installation according to claim 4, wherein the etching solutions are selected from the group consisting of KOH and NaOH.

6. The installation according to claim 3, wherein the liquid chemicals are selected from the group consisting of alkaline solutions for cleaning wafers and acidic solutions for cleaning wafers.

7. The installation according claim 1, wherein:

said clean room includes a ceiling; and said first supply lines and said second discharge lines are guided along said ceiling of said clean room.

8. The installation according to claim 1, wherein:

said clean room includes a floor; and said second supply lines and said first discharge lines are guided along said floor of said clean room.

9. The installation according to claim 1, wherein the operating substances that are supplied by said supply system include liquid operating substances that are selected from the group consisting of ultra-pure water, pure water and cooling water.

10. The installation according to claim 1, comprising:

a reservoir that is located above at least one of said plurality of said fabrication units;

the operating substances that are discharged by said supply system includes heated and contaminated waste air that is guided into said reservoir by said second discharge lines.

11. The installation according to claim 1, wherein the operating substances that are supplied by said supply system includes etching gases for carrying out etching processes.

12. The installation according to claim 11, wherein the etching gases are halogen compounds.

13. The installation according to claim 1, wherein the operating substances that are supplied by said supply system include oxygen for cleaning wafers during cleaning processes and nitrogen for drying the wafers.

14. An installation for fabricating semiconductor products, comprising:

a building having a plurality of stories including at least one middle story, at least one upper story above said at least one middle story, and at least one lower story below said at least one middle story;

a plurality of reservoirs;

a plurality of fabrication units;

at least one clean room located in said at least one middle story, said clean room having at least one of said plurality of said fabrication units;

a supply system including lines for transferring operating substances between said plurality of fabrication units and said plurality of reservoirs;

said plurality of reservoirs including reservoirs supplying operating substances of greater density than a surrounding atmosphere to said plurality of fabrication units being disposed on said at least one upper story;

said plurality of reservoirs including reservoirs receiving discharged operating substances of lesser density than the surrounding atmosphere from said plurality of fabrication units being disposed on said at least one upper story;

said plurality of reservoirs including reservoirs supplying operating substances of lesser density than a surrounding atmosphere to said plurality of fabrication units being disposed on said at least one lower story; and said plurality of reservoirs including reservoirs receiving discharged operating substances of greater density than the surrounding atmosphere from said plurality of fabrication units being disposed on said at least one lower story.

* * * * *